United States Patent
Zhao et al.

(10) Patent No.: US 11,773,484 B2
(45) Date of Patent: Oct. 3, 2023

(54) HARD MASK DEPOSITION USING DIRECT CURRENT SUPERIMPOSED RADIO FREQUENCY PLASMA

(71) Applicant: Tokyo Electron Limited, Tokyo (JP)

(72) Inventors: Jianping Zhao, Austin, TX (US); Peter Lowell George Ventzek, Austin, TX (US); Toshihiko Iwao, Austin, TX (US)

(73) Assignee: TOKYO ELECTRON LIMITED, Tokyo (JP)

(*) Notice: Subject to any disclaimer, the term of this patent is extended or adjusted under 35 U.S.C. 154(b) by 15 days.

(21) Appl. No.: 17/327,437

(22) Filed: May 21, 2021

(65) Prior Publication Data
US 2021/0404055 A1    Dec. 30, 2021

Related U.S. Application Data

(60) Provisional application No. 63/044,531, filed on Jun. 26, 2020.

(51) Int. Cl.
  *C23C 16/26* (2006.01)
  *C23C 16/46* (2006.01)
  *C23C 16/52* (2006.01)
  *C23C 16/505* (2006.01)

(52) U.S. Cl.
  CPC ............ *C23C 16/26* (2013.01); *C23C 16/463* (2013.01); *C23C 16/505* (2013.01); *C23C 16/52* (2013.01)

(58) Field of Classification Search
  CPC ..... C23C 16/26; C23C 16/463; C23C 16/505; C23C 16/52; C23C 14/0021; C23C 16/042; C23C 16/503
  See application file for complete search history.

(56) References Cited

U.S. PATENT DOCUMENTS

| 4,996,079 A | 2/1991 | Itoh | |
|---|---|---|---|
| 2006/0124059 A1* | 6/2006 | Kim | H01J 37/321 216/68 |
| 2006/0288938 A1 | 12/2006 | Veerasamy et al. | |

(Continued)

FOREIGN PATENT DOCUMENTS

| KR | 20130024294 A | 3/2013 |
|---|---|---|
| WO | 2019212592 A1 | 11/2019 |

OTHER PUBLICATIONS

Dictionary of Chemistry, 2008, p. 546 (Year: 2008).*

(Continued)

*Primary Examiner* — Katherine A Bareford
*Assistant Examiner* — Christina D McClure
(74) *Attorney, Agent, or Firm* — Slater Matsil, LLP

(57) ABSTRACT

A method of forming a carbon hard mask includes generating a radio frequency plasma including carbon-based ions by supplying continuous wave radio frequency power to a plasma processing chamber. The carbon-based ions have a first average ion energy. The method further includes adjusting the first average ion energy of the carbon-based ions to a second average ion energy by supplying continuous wave direct current power to the plasma processing chamber concurrently with the continuous wave radio frequency power and forming a carbon hard mask at a substrate within the plasma processing chamber by delivering the carbon-based ions having the second average ion energy to the substrate.

20 Claims, 7 Drawing Sheets

(56) References Cited

U.S. PATENT DOCUMENTS

2007/0048211 A1    3/2007   Jiang et al.
2014/0057447 A1*   2/2014   Yang .................... C23C 16/509
                                                       438/711
2019/0057862 A1*   2/2019   Yang ................ H01L 21/02115

OTHER PUBLICATIONS

PCT International Search Report and Written Opinion, PCT Applilcation No. PCT/US2021/037842, dated Oct. 14, 2021, 10 pages.

* cited by examiner

HARD MASK DEPOSITION USING DIRECT CURRENT SUPERIMPOSED RADIO FREQUENCY PLASMA

CROSS-REFERENCE TO RELATED APPLICATIONS

This application claims the benefit of U.S. Provisional Application No. 63/044,531, filed on Jun. 26, 2020, which application is hereby incorporated herein by reference.

TECHNICAL FIELD

The present invention relates generally to plasma processing, and, in particular embodiments, to systems and methods for plasma processing to deposit a hard mask using direct current superimposed radio frequency plasma.

BACKGROUND

Device formation within microelectronic workpieces may involve a series of manufacturing techniques including formation, patterning, and removal of a number of layers of material on a substrate. Etch masks may be formed (e.g. deposited) to protect regions of the substrate and allow for pattern transfer via etching. Obtaining a high aspect ratio during plasma etching is important for a variety of semiconductor processes such as during high aspect ratio contact (HARC) formation, during NAND formation (e.g. 3D-NAND), and others.

Carbon hard masks are widely used in semiconductor processing for etching and patterning. High quality (e.g. high etch resistance) carbon hard masks are desirable for etching and patterning in advanced device nodes because they may enable pattern transfer at high resolution with improved overlay control. For example, carbon hard masks may be used to improve the selectivity of resist to silicon and to improve the aspect ratio of features, such as in a tri-layer etch stack process.

Spin-on-carbon (SoC) hard masks can be formed with high throughput. However, the etch resistance of SoC may not be high enough to be viable for certain processes. Therefore, processes that create a high quality carbon film with high throughput may be desirable.

SUMMARY

In accordance with an embodiment of the invention, a method of forming a carbon hard mask includes generating a radio frequency plasma including carbon-based ions by supplying continuous wave radio frequency power to a plasma processing chamber. The carbon-based ions have a first average ion energy. The method further includes adjusting the first average ion energy of the carbon-based ions to a second average ion energy by supplying continuous wave direct current power to the plasma processing chamber concurrently with the continuous wave radio frequency power and forming a carbon hard mask at a substrate within the plasma processing chamber by delivering the carbon-based ions having the second average ion energy to the substrate.

In accordance with another embodiment of the invention, a method of forming a carbon hard mask includes providing continuous wave power to a plasma processing chamber. The continuous wave power including both radio frequency power and direct current power. Providing the continuous wave power includes supplying the radio frequency power to a first electrode through an impedance matching circuit and supplying the direct current power to a second electrode through a low pass filter. The radio frequency power includes a frequency greater than 60 MHz. The direct current power includes a direct current voltage between about −200 V and 200 V. The method further includes forming a carbon hard mask at a substrate within the plasma processing chamber using the continuous wave power.

In accordance with still another embodiment of the invention, a plasma processing apparatus includes a plasma processing chamber, a radio frequency electrode disposed within the plasma processing chamber, a radio frequency power source electrically coupled to the radio frequency electrode through an impedance matching circuit, a direct current power source separate from the radio frequency power source, and a substrate holder disposed in the plasma processing chamber. The radio frequency power source is configured to supply continuous wave radio frequency power to the radio frequency electrode. The continuous wave radio frequency power includes a frequency in the very high frequency range. The direct current power source is configured to supply continuous wave direct current power to the plasma processing chamber through a radio frequency choke. The continuous wave direct current power is supplied concurrently with the continuous wave radio frequency power.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
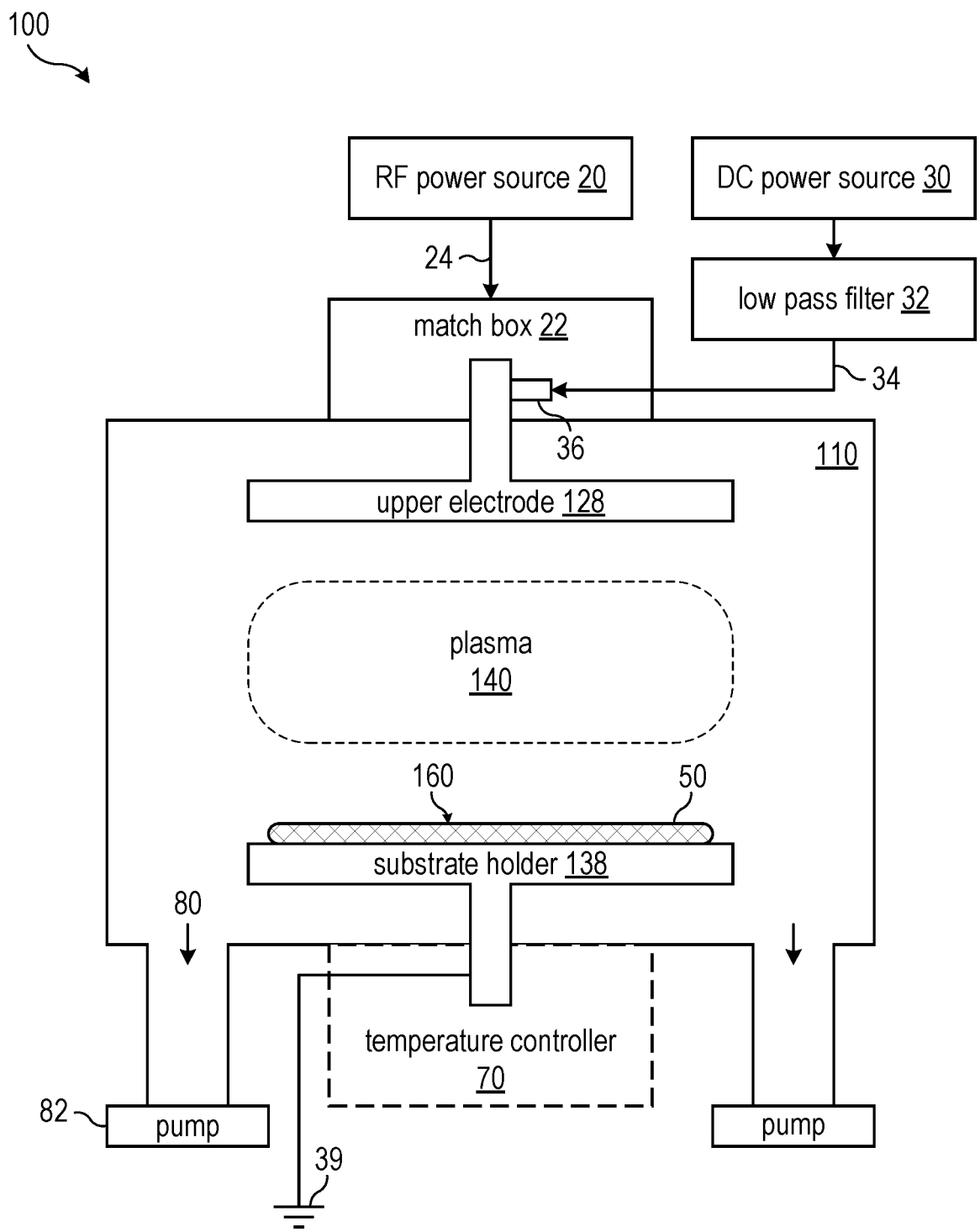
FIG. 1 illustrates an example plasma processing apparatus including an upper electrode that receives both RF power and DC power in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

SoC is typically used to form high-throughput carbon hard masks. However, the etch resistance of SoC is not high enough for many high aspect ratio process, such as in HARC processes and NAND-type applications. One factor negatively impacting the etch resistance of SoC is that SoC has very low or zero $sp^3$ carbon-carbon (C—C) bonding and contains mainly $sp^2$ C—C bonding ($sp^2$ referring to hybridization between an s orbital and two p orbitals). The $sp^2$ C—C bonds may be easily attacked by fluorine- or oxygen-based plasma species. In comparison, $sp^3$ C—C bonds are much less reactive increasing the etch resistance of $sp^3$ C—C bonded carbon films (where $sp^3$ refers to hybridization between an s orbital and three p orbitals).

The inventors have discovered that $sp^3$ bond formation is very sensitive to the ion energy that a surface (e.g. substrate) experiences during plasma-based thin film deposition of carbon. That is, the inventors understand that a well-controlled ion energy distribution (IED) may be beneficial to control the $sp^3$ to $sp^2$ bonding ratio in a carbon film. For example, a well-controlled IED may be narrow and have optimal peak ion energy. Further, the inventors also note that low deposition rates may not be favorable for high $sp^3$ bond formation.

Therefore, a plasma processing apparatus that can provide optimal ion energy and deposition characteristics for $sp^3$ C—C bond formation may be desirable for high throughput formation of carbon films with increased etch resistance over conventional carbon films.

Radio frequency (RF) power may be used to obtain low energy ions with a narrow IED. For example, the RF power may have a frequency in the high frequency (HF) range, very high frequency (VHF) range, and higher. As the frequency of the RF power increases, the IED may narrow promoting a well-defined peak ion energy. However, the peak ion energy may also decrease as the RF power frequency increases. Additionally, conventional RF plasma deposition (including low frequency (LF), HF, and VHF plasmas) has coupled ion energy and ion flux.

The desired combination of narrow IED, optimal ion energy, and high ion flux may not be possible with conventional RF plasma deposition alone because they cannot be tuned independently. Consequently, conventional RF plasma deposition methods (including RF pulsing techniques) are not flexible enough to optimize the ion energy window and achieve desired high $sp^3$ bonding fractions in carbon films due to lower deposition rate and suboptimal plasma chemistry characteristics.

The embodiment methods and plasma processing apparatuses described herein generate a direct current (DC) field to advantageously alter the ion energy with little or no effect on the desirable characteristics of high ion/radical fluxes and narrow IED (e.g. for HF and VHF plasmas). Such competitive differentiation of RF power and DC power may beneficially shift the ion energy to an optimal ion energy for $sp^3$ carbon bond formation and narrow the IED (i.e. optimize the ion energy window). In particular, the desired $sp^3$ fraction of carbon bonds and desired carbon film properties may advantageously be obtained while maintaining high ion/radical fluxes and a narrow IED as well as high deposition rate.

In various embodiments, a plasma processing apparatus includes a plasma processing chamber. An RF electrode and a substrate holder are included in the plasma processing chamber. In some embodiments, the RF electrode may be the substrate holder. An RF power source is electrically coupled to the RF electrode through an impedance matching circuit and supplies RF power to the RF electrode at an RF frequency in the HF range, the VHF range, or higher. The RF power may be continuous wave power, for example.

The plasma processing apparatus also includes a DC power source separate from the RF power source. The DC power source supplies DC power to the plasma processing chamber through an RF choke. The DC power is supplied concurrently with the RF power. In one embodiment, the DC power is supplied to the RF electrode. In another embodiment, the DC power is supplied to the substrate holder. The DC power may also be continuous wave power.

The combination of the RF power and the DC power is used to generate a DC superimposed RF plasma in the plasma processing chamber. The DC superimposed RF plasma is advantageously used to from a carbon hard mask with a high $sp^3$ fraction on a substrate. The etch resistance of the carbon hard mask may be increased over conventional carbon films because of the high concentration of $sp^3$ bonded carbon. A potentially beneficial result is improved selectivity of the resist to silicon enabling pattern transfer at high resolution with improved overlay control.

The carbon hard mask may also advantageously have increased density. A possible advantage of the high density carbon film is that the carbon hard mask may be made thinner since the higher density is in itself more etch resistant. For example, embodiment carbon hard masks may be more dense and require less film thickness to achieve the same etch resistance as conventional carbon films (e.g. SoC films).

Altering the ion energy of an RF plasma using DC voltage may advantageously facilitate the favorable selection of an ion energy window suitable for the desired $sp^3$:$sp^2$ bonding ratio ($sp^3$ fraction) and other carbon film properties. The DC voltage may also modify the plasma sheath resulting in improved plasma uniformity.

By shifting the ion energy with a DC voltage, the narrow IED generated by the RF plasma (e.g. HF, VHF, or higher) may advantageously be maintained. Further, the high density and flux of radicals and ions of the RF plasma may also be advantageously maintained. High density and flux may carry the additional benefits of enabling greater $sp^3$ content and high throughput.

The usage of continuous wave power (e.g. continuous wave RF power) may generate high ion and radical fluxes (as opposed to pulsing methods, for example) which may further enhance the benefits of high throughput and high $sp^3$ content since high deposition rate may be beneficial for $sp^3$ bond formation. Additionally, continuous wave plasma methods may have lower cost and simpler implementation than pulsing methods.

Embodiments provided below describe various systems and methods for plasma processing, and in particular, systems and methods for plasma processing to deposit a hard mask using DC superimposed RF plasma. The following description describes the embodiments. FIG. 1 is used to describe an embodiment plasma processing apparatus. Three more embodiment plasma processing apparatuses are described using FIGS. 2-4. An example plasma processing chamber is described using FIG. 5. Two embodiment methods of plasma processing are described using FIGS. 6 and 7.

FIG. 1 illustrates an example plasma processing apparatus including an upper electrode that receives both RF power and DC power in accordance with an embodiment of the invention.

Referring to FIG. 1, a plasma processing apparatus 100 includes a plasma processing chamber 110. An RF power source 20 that is configured to supply RF power 24 is electrically coupled to an RF electrode of the plasma processing apparatus 100 through an impedance matching circuit 22 (e.g. a match box). For example, the RF power source 20 may be electrically coupled to an upper electrode 128 as shown. However, the RF power source 20 may alternatively be electrically coupled to other electrodes such as a substrate holder, for example.

The RF power 24 is provided to the plasma processing apparatus 100 by the RF power source 20. That is, the plasma processing apparatus 100 is an RF powered plasma processing apparatus and may be part of an RF powered plasma system. The RF power 24 comprises a sufficiently high frequency to generate desirable IED and flux characteristics. For example, the frequency of the RF power 24 may be in the HF range, the VHF range, or higher. In some embodiments, the RF power 24 comprises a frequency greater than about 60 MHz. In various embodiments, the RF power 24 comprises a frequency between about 60 MHz and about 300 MHz.

The frequency of the RF power 24 may be advantageously used to provide high density and flux of radicals and ions while maintaining a low ion energy and narrow IED. For instance, increasing the frequency of the RF power 24 while keeping the power of the RF power 24 constant may increase ion flux, narrow IED, and decrease peak ion energy.

A DC power source 30 that is configured to supply DC power 34 is electrically coupled to a DC electrode of the plasma processing apparatus 100 through a low pass filter 32. The DC electrode may be the same electrode as the RF electrode or a different electrode. For instance, the DC power source 30 may be electrically coupled to the upper electrode 128 as shown (e.g. using a DC power tap 36). However, like the RF power source 20, the DC power source 30 may alternatively be electrically coupled to other electrodes such as a substrate holder, for example.

The DC power 34 is added to the plasma processing apparatus 100 by the DC power source 30. The DC power source 30 applies an adjustable DC voltage $V_{DC}$ to the DC electrode. In some embodiments, $V_{DC}$ is applied to the same electrode as the RF power 24 superimposing the DC power 34 onto the RF power 24. In one embodiment, both the RF power 24 and the DC power 34 are applied to the substrate holder 138 thereby superimposing $V_{DC}$ onto the RF power 24. However, $V_{DC}$ can also be applied to a bottom electrode (e.g. a substrate holder), the bulk plasma body, or any part of the plasma processing chamber that is exposed to plasma.

The RF power 24 and the DC power 34 are used to generate an RF plasma 140 in the plasma processing chamber 110. The RF plasma 140 is a DC superimposed RF plasma comprising carbon-based ions. In other words, both the RF power 24 and the DC power 34 are coupled to the RF plasma 140. The RF plasma 140 may include any suitable type of RF excited plasma. For example, the RF plasma 140 may have a sufficiently narrow IED and sufficiently low peak ion energy for desired fraction of $sp^3$ C—C bond formation. In one embodiment, the RF plasma 140 is a capacitively coupled plasma (CCP). Alternatively, the RF plasma 140 may be an inductively coupled plasma (ICP), a surface wave plasma (SWP), and others.

The power supplied to the plasma processing apparatus 100 may be continuous wave power. The RF power 24 is continuous wave RF power in one embodiment. Continuous wave power may have the advantage of generating high ion and radical fluxes. A narrow IED can be obtained via RF pulsing, but the average ion/radical fluxes are significantly reduced in comparison to continuous wave RF power. Additionally, continuous wave RF power may have a lower cost and be easier to implement when compared to pulsed RF power.

Similarly, the DC power 34 may also be applied as continuous wave DC power. In various embodiments, the DC power 34 is always applied concurrently with the RF power 24. In other embodiments, the DC power 34 may be applied after the RF plasma 140 has already been ignited (e.g. by the RF power 24), may be pulsed to control charging effects, etc.

The low pass filter 32 (e.g. an RF choke) is added to the DC power 34 delivery line between the plasma processing chamber 110 and the DC power source 30 to prevent RF power from entering The DC power source 30. For example, it may be undesirable for RF current to reach the DC power source 30. The low pass filter 32 may be a series of inductors and shunt capacitors, for example. In some embodiments, the low pass filter 32 is an RF choke and is a high frequency RF choke in one embodiment. The high frequency RF choke may be designed to appropriately filter out the frequency and corresponding harmonics of the RF power 24, such as HF frequencies, VHF frequencies, or higher frequencies.

Still referring to FIG. 1, a substrate holder 138 is included in the plasma processing chamber 110. Optionally, the substrate holder 138 may be electrically coupled to a ground connection 39 as shown. Alternatively, the substrate holder 138 may be left floating. The substrate holder 138 is configured to support a substrate 50. The substrate 50 may be of any suitable type and material and be at any suitable stage of processing. In various embodiments, the substrate 50 includes a semiconductor material. The substrate 50 may also include various insulating and/or conducting materials. In one embodiment, the substrate 50 is comprises silicon.

The plasma processing chamber 110 is a vacuum chamber and may be evacuated using one or more vacuum pumps 82, such as a single stage pumping system or a multistage pumping system (e.g. a mechanical roughing pump combined with one or more turbomolecular pumps). For example, vacuum pumps 82 may be configured to remove gas from the plasma processing chamber 110 through on or more gas outlets 80. In order to promote even gas flow during plasma processing, gas may be removed from more than one gas outlet or location in the plasma processing chamber 110 (e.g. on opposite sides of the substrate 50, a ring around the substrate 50, etc.).

One or more sources of carbon may be included in the plasma processing apparatus 100 from which the carbon-based ions of the RF plasma 140 are formed. For example, a precursor gas containing carbon (along with other gases such as a carrier gas, and additive gases) may be included. In one embodiment, a hydrocarbon precursor gas is pumped into the plasma processing chamber 110. Alternatively or additionally, gaseous carbon may be generated from a solid target. A direct source of carbon-based ions (e.g. a carbon ion beam) may also be used in some cases.

RF plasma 140 is used to form (e.g. deposit) a carbon hard mask 160 at the substrate 50. Carbon is the primary constituent of the carbon hard mask 160, although other components may be intentionally or inadvertently included. In one embodiment, the carbon hard mask 160 is an amorphous carbon film. The etch resistance of the carbon hard mask 160 may advantageously be controlled through appropriate selection of the frequency and power of the RF power 24 and the voltage of the DC power 34. For example, an increased fraction of C—C bonds that are sp$^3$ bonded (sp$^3$ fraction) may be possible when compared with conventional carbon film formation techniques.

In some embodiments the sp$^3$ fraction of the carbon hard mask 160 is greater than about 0.2 (i.e. 20% of C—C bonds) and is greater than about 0.6 in various embodiments. For example, the sp$^3$ fraction may be about 0.2, about 0.3, about 0.4, and so on. In some embodiments, the sp$^3$ fraction of the carbon hard mask 160 is greater than about 0.8. As the sp$^3$ fraction increases, the concentration of hydrogen (i.e. C—H bonds) may decrease, the carbon film density may increase, and the etch rate may also decrease.

In amorphous carbon films, C—C sp$^3$ bonds are considered diamond-like while C—C sp$^2$ bonds are considered graphite-like. The desired sp$^3$ fraction may depend on the application. For example, diamond-like carbon may provide desired etch resistance (e.g. for desired selectivity) for HARC and high aspect ratio NAND applications. The carbon hard mask 160 may be a predominantly, substantially, or completely diamond-like carbon film (e.g. ta-C, ta-C:H).

The adjustable DC voltage $V_{DC}$ supplied by the DC power source 30 can range from positive to negative. In some embodiments, the DC power 34 is coupled to the upper electrode 128 and $V_{DC}$ has a positive DC voltage. A positive DC voltage at the upper electrode 128 may advantageously adjust (e.g. increase) the average ion energy. For example, the average ion energy of the carbon-based ions as well as other ions such as carrier gas ions may be adjusted. In various embodiments, the DC voltage $V_{DC}$ coupled to the upper electrode 128 is in the range of 0 V to about 200 V. In one embodiment, the DC voltage $V_{DC}$ coupled to the upper electrode 128 is about 200 V.

The sign of $V_{DC}$ (e.g. the relation of the $V_{DC}$ to a reference voltage such as a ground voltage) may depend on the adjustment of ion energy for desired degree of sp$^3$ formation in the carbon hard mask 160. For example, the superimposed DC voltage $V_{DC}$ may be applied and adjusted to a proper value to control the sheath voltage or the plasma potential of the RF plasma 140. This in turn may advantageously facilitate shifting the peak ion energy of the RF plasma 140.

As mentioned throughout, the proper ion energy window may be important to achieve a high sp$^3$ bonding concentration and high density in the carbon hard mask 160. For example, a defined peak in sp$^3$ fraction may be present for a given ion energy range (e.g. with a max sp$^3$ at about 110 eV). Similarly, the density curve of the carbon film versus energy per carbon atom may be approximately the same shape as the sp$^3$ fraction versus ion energy curve, with a somewhat sharper peak (e.g. with a maximum density at about 100 eV/carbon atom).

Since narrowing the IED and increasing ion and radical fluxes (e.g. at peak energy) by increasing the frequency of the RF power 24 may result in decreasing ion energy, the average ion energy in RF plasma 140 without the DC power 34 may not be in the proper energy window. Once the DC power 34 is included the average ion energy may be adjusted (e.g. increased) to a desired ion energy (whether simultaneously with the RF power 24 or added to the RF power 24 at some point after plasma ignition). For example, when only the RF power 24 is applied the average ion energy may be a first average ion energy while the average ion energy may be a second average ion energy when the combination of the RF power 24 and the DC power 34 are applied.

The DC power 34 may affect the average ion energy of all ion species in the RF plasma 140. For example, the average ion energy of carbon-based ions as well as carrier gas or dilute gas ions may be adjusted by the DC power 34. As a result, the DC power 34 may be used to adjust the average ion energy of the carbon-based ions to a desired average ion energy and/or adjust the average ion energy of other ions such as carrier gas or dilute gas ions to a desired average ion energy.

In some embodiments, the second average ion energy is greater than about 20 eV and is greater than about 100 eV in various embodiments. For example, the second average ion energy may be between about 20 eV and about 200 eV and is about 20 eV in one embodiment. In some embodiments, the second average ion energy is between about 100 eV and about 150 eV. In one embodiment, the second average ion energy is about 120 eV. However, the second average ion energy may also be higher or lower and may depend on a variety of specific factors including RF frequency, precursor, RF power, electrode to substrate gap, pressure, deposition rate, gas flow ratios, carrier gas type, and others. It should also be noted that the DC power 34 can also be used to lower the average ion energy into a desired ion energy window.

The voltage at the RF electrode may be relatively low while the current may be relatively high. For instance, a large supply current may be desirable in order to alter the potential at the electrode surface with a low voltage. For example, the DC power source 30 may be configured to supply enough DC current to match the plasma current in order to adjust the DC self-bias and/or the plasma potential.

The DC electrode (e.g. the electrode that receives the DC power 34 which shown here as the upper electrode 128) is DC conductive. However, applying a DC voltage (e.g. $V_{DC}$) to an electrode in a plasma processing chamber may pose a risk of sputtering. For example, a negative DC voltage may cause erosion of the electrode surface resulting in contamination of the plasma process. Consequently, the electrode may comprise DC conductive materials that are compatible with the process. In one embodiment, the DC electrode comprises highly doped silicon. In one embodiment, the DC electrode comprises graphite. The DC electrode may be made of a single material or be a composite of materials.

An optional temperature controller 70 may be included to control the temperature of the substrate 50 during plasma processing. The optional temperature controller 70 is thermally coupled to the substrate holder 138. In one embodiment, the optional temperature controller 70 includes a heating element. In one embodiment, the optional temperature controller 70 includes a cooling element. The temperature of the substrate 50 (e.g. a wafer) may fluctuate during plasma processing (e.g. high ion/radical flux may heat up the wafer). Consequently, the optional temperature controller 70 may be configured to maintain the substrate 50 within a desired temperature range. For example, the optional temperature controller 70 may be configured to cool the substrate 50 during plasma processing.

Lower temperatures during plasma processing may be advantageous to protect structures already on the substrate 50. Further, lower temperatures may also improve the properties of the carbon hard mask 160 (e.g. higher sp$^3$ fraction, density, etc.). In one embodiment, the temperature of the substrate 50 during formation of the carbon hard mask 160 is less than about 200° C.

Figure 2:
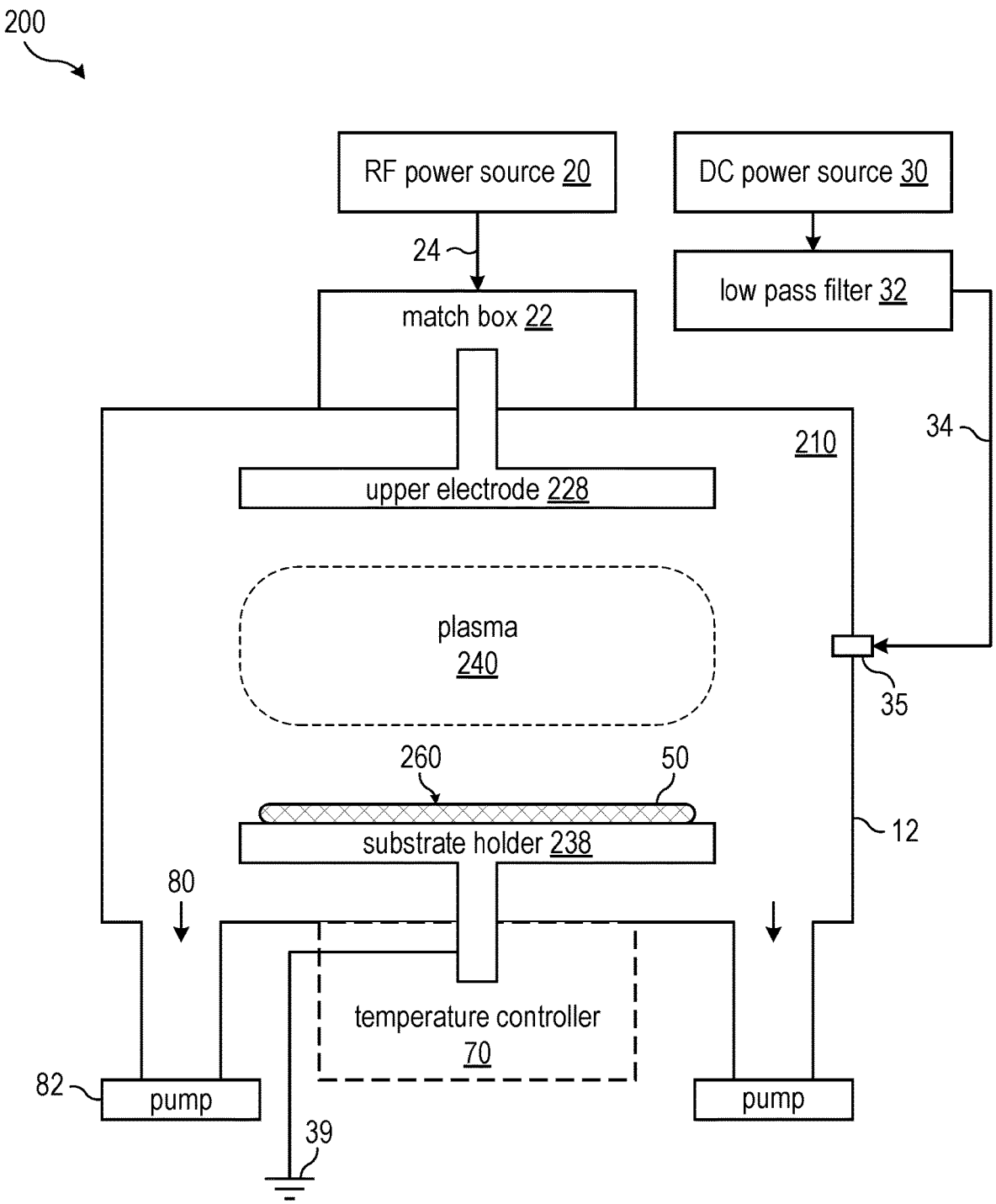
FIG. 2 illustrates an example plasma processing apparatus including an upper electrode that receives RF power and a DC power vacuum feedthrough that applies DC power to a plasma processing chamber in accordance with an embodiment of the invention.
Figure 3:
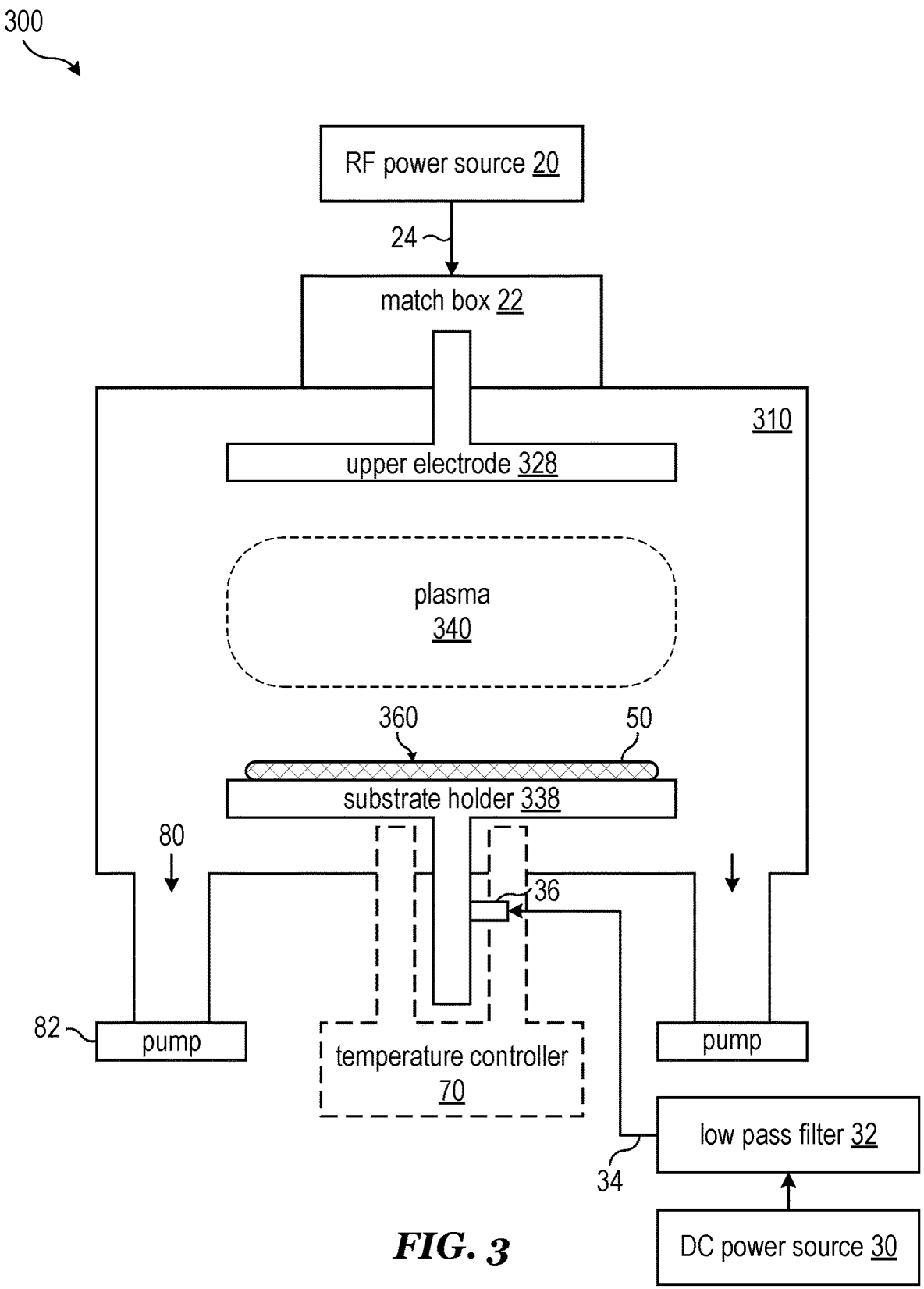
FIG. 3 illustrates an example plasma processing apparatus including an upper electrode that receives RF power and a substrate holder that receives DC power in accordance with an embodiment of the invention.
Figure 4:
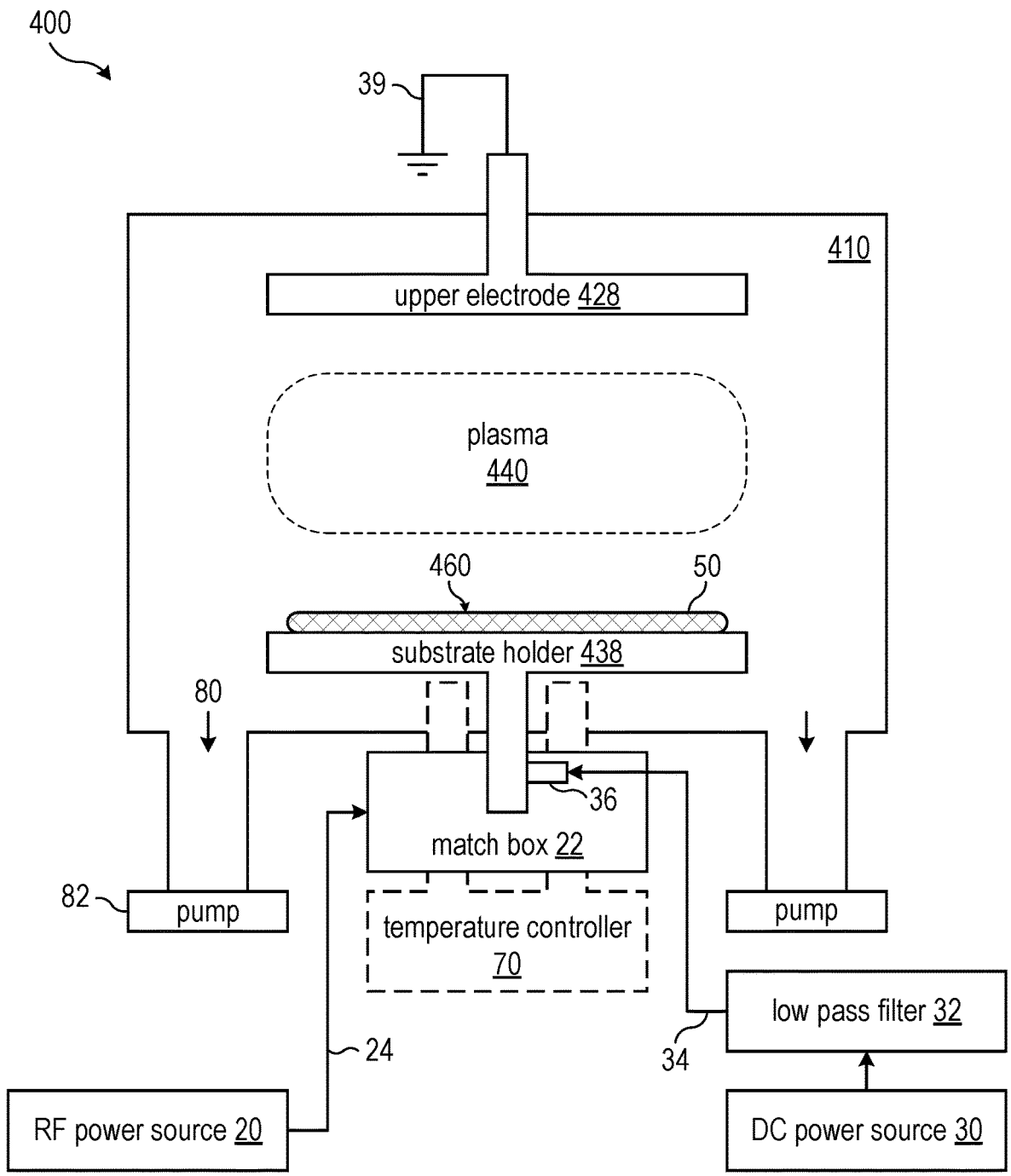
FIG. 4 illustrates an example plasma processing apparatus including an upper electrode and a substrate holder that receives both RF power and DC power in accordance with an embodiment of the invention.

FIGS. 2-4 illustrate alternate configurations of a plasma processing apparatus including an RF electrode receiving RF power and a DC electrode receiving DC power. Whereas the plasma processing apparatus 100 of FIG. 1 is a specific implementation of such a plasma processing apparatus where the RF electrode and the DC electrode are a single upper electrode, the following example plasma processing apparatuses also represent specific implementations with different configurations of the RF electrode and the DC electrode.

FIG. 2 illustrates an example plasma processing apparatus including an upper electrode that receives RF power and a DC power vacuum feedthrough that applies DC power to a plasma processing chamber in accordance with an embodiment of the invention. The plasma processing apparatus of FIG. 2 may be a specific implementation of other plasma processing apparatuses described herein such as the plasma processing apparatus of FIG. 1, for example. Similarly labeled elements may be as previously described.

Referring to FIG. 2, a plasma processing apparatus 200 includes an upper electrode 228 and a substrate holder 238 disposed in a plasma processing chamber 210. It should be noted that here and in the following a convention has been adopted for brevity and clarity wherein elements adhering to the pattern×10 may be related implementations of a plasma processing chamber in various embodiments. For example, the plasma processing chamber 210 may be similar to the plasma processing chamber 110 except as otherwise stated. An analogous convention has also been adopted for other elements as made clear by the use of similar terms in conjunction with the aforementioned three-digit numbering system.

Similar to the plasma processing apparatus 100, the upper electrode 228 receives the RF power 24 from the RF power source 20. However in contrast to the plasma processing apparatus 100, in the configuration of the plasma processing apparatus 200, the DC power 34 is supplied to the plasma processing chamber 210 using a DC power vacuum feedthrough 35. For example, the DC power vacuum feedthrough 35 may be configured to apply the DC power 34 directly to the plasma processing chamber 210 or to another conducting surface within the plasma processing chamber 210 through a wall 12 (e.g. a vertical wall as shown) of the plasma processing chamber 210.

In the configuration of the plasma processing apparatus 200, the DC power 34 may be advantageously applied directly to an RF plasma 240 generated using the RF power 24 applied to the upper electrode 228. Due to the variable positioning of the DC power vacuum feedthrough 35 on the wall 12 (and also to the flexibility of what conductive regions receive the DC power 34), the DC voltage $V_{DC}$ provided by the DC power 34 may vary depending on the specific implementation. For example, $V_{DC}$ may range from a positive voltage to a negative voltage.

The DC voltage $V_{DC}$ is used to shift the average ion energy of the RF plasma 240 to the desire ion energy for the formation of a carbon hard mask 260 with desired properties (e.g. high sp$^3$ fraction, high density). In various embodiments, $V_{DC}$ has a positive voltage. For example, in some embodiments, $V_{DC}$ is in the range of 0 V to about 200 V. In other embodiments, $V_{DC}$ has a negative voltage. In some embodiments, $V_{DC}$ is in the range of 0 V to about −200 V.

FIG. 3 illustrates an example plasma processing apparatus including an upper electrode that receives RF power and a substrate holder that receives DC power in accordance with an embodiment of the invention. The plasma processing apparatus of FIG. 3 may be a specific implementation of other plasma processing apparatuses described herein such as the plasma processing apparatus of FIG. 1, for example. Similarly labeled elements may be as previously described.

Referring to FIG. 3, a plasma processing apparatus 300 includes an upper electrode 328 and a substrate holder 338 disposed in a plasma processing apparatus 310. Similar to the plasma processing apparatus 100, the upper electrode 328 receives the RF power 24 from the RF power source 20. However in contrast to the plasma processing apparatus 100, in the configuration of the plasma processing apparatus 300, the substrate holder 338 (e.g. the wafer stage) receives the DC power 34 from the DC power source 30.

As before, the DC voltage $V_{DC}$ is used to shift the average ion energy of an RF plasma 340 to the desire ion energy for the formation of a carbon hard mask 360 with desired properties. $V_{DC}$ may range from a positive voltage to a negative voltage. In some embodiments, $V_{DC}$ has a negative voltage. In various embodiments, $V_{DC}$ is in the range of 0 V to about −200 V. In one embodiment, $V_{DC}$ is about −200 V.

In some cases, (e.g. when the substrate 50 includes a dielectric material) charge buildup may occur. That is, the substrate 50 may build up charge due to the presence of a DC voltage. This charge buildup may be mitigated by pulsing the DC power 34 to the substrate holder 338 to dissipate charge buildup. In one embodiment, the RF power 24 is applied as continuous wave RF power while the DC power 34 is applied as pulsed DC power.

FIG. 4 illustrates an example plasma processing apparatus including an upper electrode and a substrate holder that receives both RF power and DC power in accordance with an embodiment of the invention. The plasma processing apparatus of FIG. 4 may be a specific implementation of other plasma processing apparatuses described herein such as the plasma processing apparatus of FIG. 1, for example. Similarly labeled elements may be as previously described.

Referring to FIG. 4, a plasma processing apparatus 400 includes an upper electrode 428 and a substrate holder 438 disposed in a plasma processing apparatus 410. Similar to the plasma processing apparatus 300, the substrate holder 438 receives the DC power 34 from the DC power source 30. However in contrast to the plasma processing apparatus 300, in the configuration of the plasma processing apparatus 400, the substrate holder 438 (e.g. the wafer stage) also receives the RF power 24 from the RF power source 20. The upper electrode 428 may be configured as a counter electrode that may be grounded (as shown) or left floating.

Again, the DC voltage $V_{DC}$ is used to shift the average ion energy of an RF plasma 440 to the desire ion energy for the formation of a carbon hard mask 460 with desired properties. $V_{DC}$ may range from a positive voltage to a negative voltage. In some embodiments, $V_{DC}$ has a negative voltage. In various embodiments, $V_{DC}$ is in the range of 0 V to about −200 V. In one embodiment, $V_{DC}$ is about −200 V.

Figure 5:
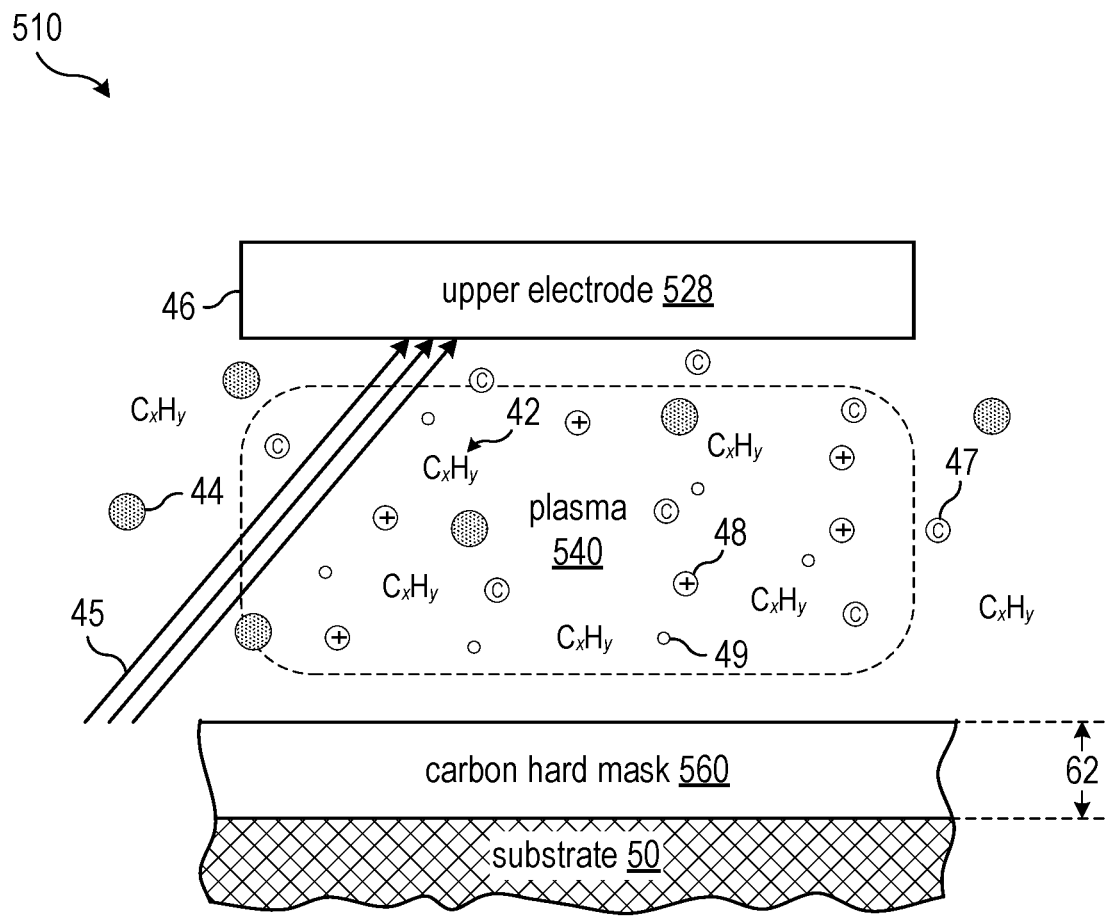
FIG. 5 illustrates an example plasma processing chamber including an RF plasma generated between an upper electrode and a substrate to form a carbon hard mask on the substrate in accordance with an embodiment of the invention.

FIG. 5 illustrates an example plasma processing chamber including an RF plasma generated between an upper electrode and a substrate to form a carbon hard mask on the substrate in accordance with an embodiment of the invention. The plasma processing chamber of FIG. 5 may be a specific implementation of other plasma processing chambers as described herein such as the plasma processing chamber of FIG. 1, for example. Similarly labeled elements may be as previously described.

Referring to FIG. 5, a plasma processing chamber 510 includes an upper electrode 528 and disposed over the substrate 50 that is used to generate an RF plasma 540 in the plasma processing chamber 510. The RF plasma 540 forms a carbon hard mask 560 on the substrate 50.

RF plasma 540 includes carbon-based ions 48 and electrons 49. The carbon (or carbon ions) needed to form the carbon-based ions 48 may be supplied to the plasma processing chamber 510 in a variety of ways. For example, a hydrocarbon precursor gas 42 ($C_xH_y$) may be introduced into the plasma processing chamber 510 through a gas inlet (e.g. along with a carrier gas 44 and one or more additive gases). For example, the upper electrode 528 may have a showerhead configuration including a plurality of appropriately spaced gas inlets. Alternatively, gas may be introduced through dedicated gas inlets of any other suitable configuration.

In various embodiments, the hydrocarbon precursor gas 42 comprises a short chain hydrocarbon gas. For example, in the above general equation, x may be two or one. In one embodiment, the hydrocarbon precursor gas 42 comprises acetylene gas (ethyne gas, $C_2H_2$). In one embodiment, the hydrocarbon precursor gas 42 comprises methane gas ($CH_4$). A myriad of other possible gases can also be used, including ethylene gas (ethene gas, $C_2H_4$), ethane gas ($C_2H_6$), and others. For instance, any carbon containing chemical with high vapor pressure may be used such as acetone, methanol, etc. (although many other considerations may drive the decision of appropriate hydrocarbon precursor gas for a given application).

A higher C:H (x:y) ratio may be beneficial for the achieving the formation of the carbon hard mask 560 with desired properties. For example, the inclusion of hydrogen in the carbon hard mask 560 may decrease the density of the carbon hard mask 560. Therefore, less hydrogen in the hydrocarbon precursor gas 42 may be advantageous when very dense films are desired. In one embodiment, the C:H ratio of the hydrocarbon precursor gas 42 is about 1. In various embodiments, the hydrogen fraction of the carbon hard mask 560 (fraction hydrogen atoms to carbon atoms) is less than about 10%. The hydrogen fraction may be less than about 1%.

The carrier gas 44 may be included to control the plasma density and density of reactive species. The carrier gas 44 may be an inert (or at least process inert) gas. In one embodiment, the carrier gas 44 comprises argon gas (Ar). In one embodiment, the carrier gas 44 comprises hydrogen gas ($H_2$). In one embodiment, the carrier gas 44 comprises helium gas (He). Other carrier/additive gases may also be combined/included. Further, additional species may also be included in the plasma 540. For example, radicals and dissociation products (not shown) may also be present. The illustration of the plasma 540 is intended to be a schematic representation and may omit a variety of other possible species in the interest of clarity.

Other sources of carbon may be used in addition to or instead of the hydrocarbon precursor gas 42. For example, the upper electrode 528 may comprise carbon (e.g. a graphite electrode) and sputter gaseous carbon 47 into the plasma processing chamber 510 (e.g. as a result of the DC voltage $V_{DC}$). The gaseous carbon 47 may then be ionized in RF plasma 540. Sputtered carbon may have the advantage of producing low- or zero-hydrogen carbon films. However, the erosion rate may be small and deposition rate may be lower. Deposition rate may be important because the carbon hard mask 560 may comprise a mask thickness 62 that is relatively large in some applications.

Other direct carbon sources that have a higher deposition rate may also be used, such a beam 45 impinging on a solid target 46 (e.g. the upper electrode 528 as shown or a separate target). For example, the beam 45 may be a laser (e.g. for laser ablation) or an ion beam (e.g. for ion bombardment). Arc evaporation methods may also be used. The advantage of higher deposition rate may need to be balanced with disadvantages such as reduced uniformity, unwanted particle generation, higher process temperatures (e.g. for arc evaporation), etc.

The mask thickness 62 may be relatively thick. For example, the mask thickness 62 may be greater than about 300 nm. In various embodiments, the mask thickness 62 is greater than about 2000 nm. In some embodiments, the mask thickness 62 is between about 300 nm and about 3000 nm and is about 2500 nm in one embodiment.

Within the carbon hard mask 560, the $sp^2$ bonds may be more reactive than $sp^3$ bonds. Therefore, reactive additives (e.g. small amounts) may be added into the plasma processing chamber 510 that preferentially attack $sp^2$ bonds advantageously etching away $sp^2$ bonding and increasing the $sp^3$ fraction of the carbon hard mask 560. For example, oxygen (e.g. $O_2$ gas) is included in the plasma processing chamber 510 in some embodiments. To the extent that sp bonds are present in the carbon hard mask 560, the additives may also etch away sp bonds (sp referring to hybridization between an s orbital and a p orbital).

Figure 6:
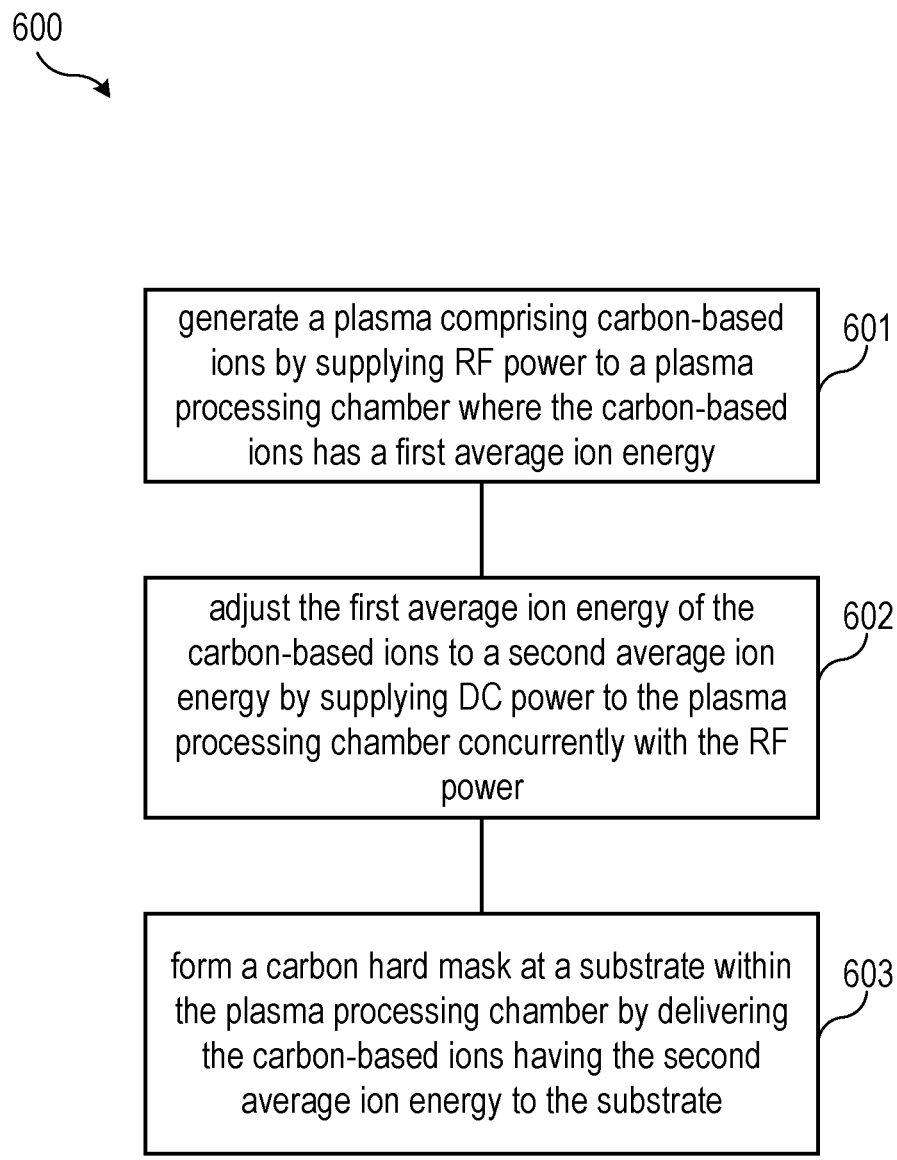
FIG. 6 illustrates an example method of forming a carbon hard mask in accordance with an embodiment of the invention.

FIG. 6 illustrates an example method of forming a carbon hard mask in accordance with an embodiment of the invention. The method of FIG. 6 may be performed using the plasma processing apparatuses as described herein. For example, the method of FIG. 6 may be combined with any of the embodiments of FIGS. 1-5. Although shown in a logical order, the arrangement and numbering of the steps of FIG. 6 are not intended to be limited. The method steps of FIG. 6 may be performed in any suitable order or concurrently with one another as may be apparent to a person of skill in the art.

Referring to FIG. 6, step 601 of a method 600 of forming a carbon hard mask is to generate a plasma comprising carbon-based ions by supplying RF power to a plasma processing chamber where the carbon-based ions have a first average ion energy. The plasma may also include additional species (e.g. carbon-based species such as carbon radicals). The RF power may be continuous wave RF power. That is, the RF power may be applied continuously as opposed to being applied as pulses.

Step 602 is to adjust the first average ion energy of the carbon-based ions to a second average ion energy by supplying DC power to the plasma processing chamber concurrently with the RF power. Similar to the RF power, The DC power may be continuous wave DC power. For example, the first average ion energy may be increased or decreased. The average energy of other ions (and charged species) may also be affected by supplying the DC power. For example, the average ion energy of carrier gas or dilute gas ions (e.g. $Ar^+$) may also be adjusted using the supplied DC power. The desired ion energy may be that of the carrier gas or dilute gas ions in some implementations.

A carbon hard mask is formed at a substrate within the plasma processing chamber by delivering the carbon-based ions having the second average ion energy to the substrate in step 603. Step 601, step 602, and step 603 may be performed repeatedly, continuously, or cyclically until a desired thickness of the carbon hard mask is obtained.

Figure 7:
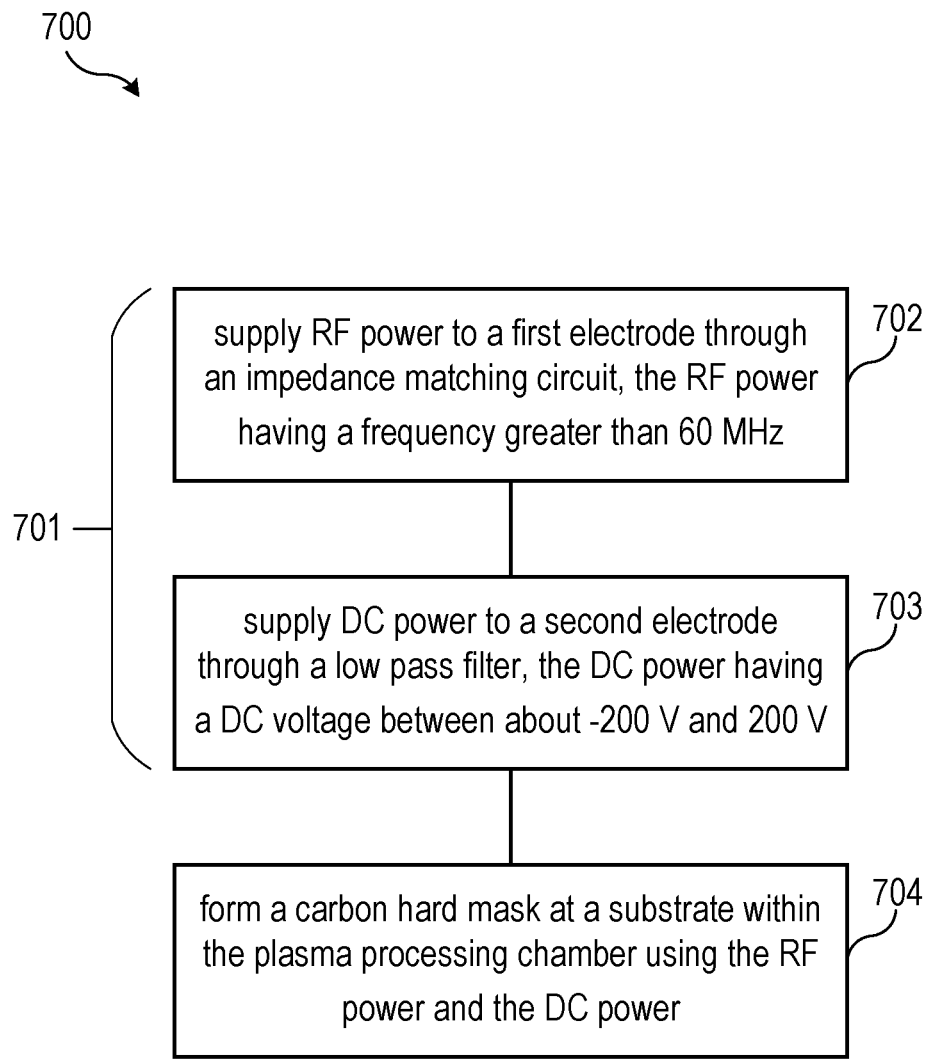
FIG. 7 illustrates another example method of forming a carbon hard mask in accordance with an embodiment of the invention.

FIG. 7 illustrates another example method of forming a carbon hard mask in accordance with an embodiment of the invention. The method of FIG. 7 may be combined with other methods and performed using the plasma processing apparatuses as described herein. For example, the method of FIG. 7 may be combined with any of the embodiments of FIGS. 1-6. Although shown in a logical order, the arrangement and numbering of the steps of FIG. 7 are not intended to be limited. The method steps of FIG. 7 may be performed in any suitable order or concurrently with one another as may be apparent to a person of skill in the art.

Referring to FIG. 6, step 701 of a method 700 of forming a carbon hard mask is to provide continuous wave power to a plasma processing chamber. The continuous wave power includes both RF power and DC power. That is, providing the continuous wave power includes a step 702 of supplying the RF power to a first electrode through an impedance matching circuit and a step 703 of supplying the DC power to a second electrode through a low pass filter. The RF power has a frequency greater than 60 MHz. The DC power has a DC voltage between about −200 V and 200 V.

Step 704 is to form a carbon hard mask at a substrate within the plasma processing chamber using the RF power and the DC power. Step 701 including step 702 and step 703 as well as step 704 may be performed repeatedly, continuously, or cyclically until a desired thickness of the carbon hard mask is obtained.

Example embodiments of the invention are summarized here. Other embodiments can also be understood from the entirety of the specification as well as the claims filed herein.

Example 1. A method of forming a carbon hard mask, the method including: generating a RF plasma including carbon-based ions by supplying continuous wave RF power to a plasma processing chamber, the carbon-based ions having a first average ion energy; adjusting the first average ion energy of the carbon-based ions to a second average ion energy by supplying continuous wave DC power to the plasma processing chamber concurrently with the continuous wave RF power; and forming a carbon hard mask at a substrate within the plasma processing chamber by delivering the carbon-based ions having the second average ion energy to the substrate.

Example 2. The method of example 1, where the carbon hard mask includes an $sp^3$ fraction greater than about 0.2, the $sp^3$ fraction being the fraction of carbon-carbon bonds that are $sp^3$ bonded.

Example 3. The method of one of examples 1 and 2, where: the continuous wave RF power includes a frequency in the very high frequency (VHF) range; and the second average ion energy is between about 20 eV and about 200 eV.

Example 4. The method of one of examples 1 to 3, further including: providing a hydrocarbon precursor gas into the plasma processing chamber, where a portion of the carbon-based ions are formed within the RF plasma from the hydrocarbon precursor gas.

Example 5. The method of example 4, where the hydrocarbon precursor gas includes acetylene.

Example 6. The method of one of examples 4 and 5, where the hydrocarbon precursor gas includes methane.

Example 7. The method of one of examples 1 to 6, further including: vaporizing a solid target using laser ablation, ion bombardment, or arc evaporation to form gaseous carbon within the plasma processing chamber, where a portion of the carbon-based ions are formed within the RF plasma from the gaseous carbon.

Example 8. A method of forming a carbon hard mask, the method including: providing continuous wave power to a plasma processing chamber, the continuous wave power including both RF power and DC power, where providing the continuous wave power includes supplying the RF power to a first electrode through an impedance matching circuit, the RF power including a frequency greater than 60 MHz, and supplying the DC power to a second electrode through a low pass filter, the DC power including a DC voltage between about −200 V and 200 V; and forming a carbon hard mask at a substrate within the plasma processing chamber using the continuous wave power.

Example 9. The method of example 8, where the carbon hard mask includes an $sp^3$ fraction greater than about 0.6, the $sp^3$ fraction being the fraction of carbon-carbon bonds that are $sp^3$ bonded.

Example 10. The method of one of examples 8 and 9, where an average ion energy of carbon-based ions delivered to the substrate while forming the carbon hard mask is between about 20 eV and about 200 eV.

Example 11. The method of one of examples 8 to 10, further including: vaporizing a solid target using laser ablation, ion bombardment, or arc evaporation to form gaseous carbon within the plasma processing chamber, where carbon-based ions are formed from the gaseous carbon and delivered to the substrate while forming the carbon hard mask.

Example 12. The method of one of examples 8 to 11, where the first electrode and the second electrode are the same electrode.

Example 13. The method of one of examples 8 to 12, where the first electrode and the second electrode are different electrodes.

Example 14. A plasma processing apparatus including: a plasma processing chamber; a RF electrode disposed within the plasma processing chamber; an RF power source electrically coupled to the RF electrode through an impedance matching circuit, the RF power source being configured to supply continuous wave RF power to the RF electrode, the continuous wave RF power including a frequency in the very high frequency (VHF) range; a DC power source separate from the RF power source, the DC power source being configured to supply continuous wave DC power to the plasma processing chamber through an RF choke, the continuous wave DC power being supplied concurrently with the continuous wave RF power; and a substrate holder disposed in the plasma processing chamber.

Example 15. The plasma processing apparatus of example 14, where the DC power source is electrically coupled to the RF electrode through the RF choke and further configured to supply the continuous wave DC power to the plasma processing chamber by supplying the continuous wave DC power to the RF electrode.

Example 16. The plasma processing apparatus of example 15, where: the RF electrode is an upper electrode disposed over the substrate holder; and the DC power applies a positive DC voltage to the upper electrode.

Example 17. The plasma processing apparatus of example 15, where: the RF electrode is the substrate holder; and the DC power applies a negative DC voltage to the substrate holder.

Example 18. The plasma processing apparatus of example 14, where: the RF electrode is an upper electrode disposed over the substrate holder; the DC power source is electrically coupled to the substrate holder through the RF choke and further configured to supply the continuous wave DC power to the plasma processing chamber by supplying the continuous wave DC power to the substrate holder; and the DC power applies a negative DC voltage to the substrate holder.

Example 19. The plasma processing apparatus of example 14, where the DC power source is further configured to supply the continuous wave DC power to the plasma processing chamber through a wall of the plasma processing chamber using a DC power vacuum feedthrough.

Example 20. The plasma processing apparatus of one of examples 14 to 19, further including a temperature controller thermally coupled to the substrate holder and configured to cool a substrate supported by the substrate holder during plasma processing.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a carbon hard mask, the method comprising:
   generating a radio frequency (RF) plasma comprising carbon-based ions at a substrate supported by a lower electrode within a plasma processing chamber by supplying continuous wave RF power to the plasma processing chamber, the carbon-based ions having a first average ion energy;
   adjusting the first average ion energy of the carbon-based ions to a second average ion energy by supplying continuous wave direct current (DC) power through a low pass filter to an upper electrode of the plasma processing chamber concurrently with the continuous wave RF power, the DC power supplying a DC current matching the plasma current of the RF plasma; and
   forming a carbon hard mask on the substrate within the plasma processing chamber by delivering the carbon-based ions having the second average ion energy to the substrate.

2. The method of claim 1, wherein the carbon hard mask comprises an $sp^3$ fraction greater than about 0.2, the $sp^3$ fraction being the fraction of carbon-carbon bonds that are $sp^3$ bonded.

3. The method of claim 1, wherein:
   the continuous wave RF power comprises a frequency in the very high frequency (VHF) range; and
   the second average ion energy is between about 20 eV and about 200 eV.

4. The method of claim 1, further comprising:
   providing a hydrocarbon precursor gas into the plasma processing chamber, wherein a portion of the carbon-based ions are formed within the RF plasma from the hydrocarbon precursor gas.

5. The method of claim 4, wherein the hydrocarbon precursor gas comprises acetylene.

6. The method of claim 4, wherein the hydrocarbon precursor gas comprises methane.

7. The method of claim 4, further comprising:
   vaporizing a solid target using laser ablation or arc evaporation to form gaseous carbon within the plasma processing chamber, wherein a portion of the carbon-based ions are formed within the RF plasma from the gaseous carbon.

8. The method of claim 1, further comprising:
   vaporizing a solid target using laser ablation or arc evaporation to form gaseous carbon within the plasma processing chamber, wherein a portion of the carbon-based ions are formed within the RF plasma from the gaseous carbon.

9. A method of forming a carbon hard mask, the method comprising:
   providing continuous wave power to a plasma processing chamber, the continuous wave power comprising both radio frequency (RF) power to generate RF plasma comprising carbon-based ions at a substrate within the plasma processing chamber, and direct current (DC) power, wherein providing the continuous wave power comprises
      supplying the RF power to a first electrode through an impedance matching circuit, the RF power comprising a frequency greater than 60 MHz to narrow the ion energy distribution (IED) of the carbon-based ions and decrease the average ion energy of the carbon-based ions, and
      supplying the DC power to a second electrode through a low pass filter to increase the average ion energy of the carbon-based ions while maintaining the narrowed IED of the carbon-based ions, the DC power comprising a DC voltage between about −200 V and 200 V and supplying a DC current matching the plasma current of the RF plasma; and
   forming a carbon hard mask on the substrate within the plasma processing chamber using the continuous wave power.

10. The method of claim 9, wherein the carbon hard mask comprises an $sp^3$ fraction greater than about 0.6, the $sp^3$ fraction being the fraction of carbon-carbon bonds that are $sp^3$ bonded.

11. The method of claim 9, wherein an average ion energy of carbon-based ions delivered to the substrate while forming the carbon hard mask is between about 20 eV and about 200 eV.

12. The method of claim 9, further comprising:
   vaporizing a solid target using laser ablation or arc evaporation to form gaseous carbon within the plasma processing chamber, wherein the carbon-based ions are formed from the gaseous carbon and delivered to the substrate while forming the carbon hard mask.

13. The method of claim 9, wherein the first electrode and the second electrode are the same electrode.

14. The method of claim 9, wherein the first electrode and the second electrode are different electrodes.

15. The method of claim 9, further comprising:
   providing a hydrocarbon precursor gas into the plasma processing chamber, wherein the carbon-based ions are formed from the hydrocarbon precursor gas and delivered to the substrate while forming the carbon hard mask; and
   vaporizing a solid target using laser ablation or arc evaporation to form gaseous carbon within the plasma processing chamber, wherein a portion of the carbon-based ions are formed from the gaseous carbon and delivered to the substrate while forming the carbon hard mask.

16. The method of claim 9, further comprising:
   providing a hydrocarbon precursor gas into the plasma processing chamber, wherein the carbon-based ions are formed from the hydrocarbon precursor gas and delivered to the substrate while forming the carbon hard mask.

17. A method of forming a carbon hard mask, the method comprising:
   providing a hydrocarbon precursor gas into a plasma processing chamber;
   generating a radio frequency (RF) plasma comprising carbon-based ions at a substrate supported by a lower electrode within the plasma processing chamber by supplying continuous wave RF power comprising a frequency in the very high frequency (VHF) range to an upper electrode of the plasma processing chamber, the carbon-based ions having a first average ion energy, wherein a portion of the carbon-based ions are formed within the RF plasma from the hydrocarbon precursor gas;

adjusting the first average ion energy of the carbon-based ions to a second average ion energy by supplying continuous wave direct current (DC) power through a low pass filter to the upper electrode of the plasma processing chamber concurrently with the continuous wave RF power, the DC power supplying a DC current matching the plasma current of the RF plasma; and forming a carbon hard mask on the substrate within the plasma processing chamber by delivering the carbon-based ions having the second average ion energy to the substrate.

18. The method of claim 17, further comprising:

vaporizing a solid target using laser ablation or arc evaporation to form gaseous carbon within the plasma processing chamber, wherein a portion of the carbon-based ions are formed within the RF plasma from the gaseous carbon.

19. The method of claim 17, wherein the carbon hard mask comprises an $sp^3$ fraction greater than about 0.2, the $sp^3$ fraction being the fraction of carbon-carbon bonds that are $sp^3$ bonded.

20. The method of claim 17, wherein the hydrocarbon precursor gas comprises acetylene.

* * * * *